US009867313B2

(12) United States Patent
Kuwahara

(10) Patent No.: US 9,867,313 B2
(45) Date of Patent: Jan. 9, 2018

(54) TRANSMITTER AND ELECTRONIC DEVICE

(71) Applicant: Kabushiki Kaisha Toshiba, Minato-ku, Tokyo (JP)

(72) Inventor: Shinichi Kuwahara, Hino Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/162,893

(22) Filed: May 24, 2016

(65) Prior Publication Data

US 2017/0064865 A1 Mar. 2, 2017

(30) Foreign Application Priority Data

Aug. 24, 2015 (JP) .................................. 2015-165168

(51) Int. Cl.
*H05K 7/20* (2006.01)

(52) U.S. Cl.
CPC ....... *H05K 7/20154* (2013.01); *H05K 7/2039* (2013.01); *H05K 7/20909* (2013.01)

(58) Field of Classification Search
None
See application file for complete search history.

(56) References Cited

U.S. PATENT DOCUMENTS

| | | | | |
|---|---|---|---|---|
| 4,520,425 A * | 5/1985 | Ito | ......................... | H02M 7/003 165/80.2 |
| 5,218,516 A * | 6/1993 | Collins | .............. | H05K 7/20545 361/715 |
| 5,235,491 A * | 8/1993 | Weiss | ................. | H05K 7/20918 307/151 |
| 5,276,584 A * | 1/1994 | Collins | .............. | H05K 7/20545 165/185 |
| 6,320,776 B1 * | 11/2001 | Kajiura | ................. | H02M 7/003 361/709 |
| 6,493,227 B2 * | 12/2002 | Nielsen | .............. | H05K 7/20918 165/185 |
| 6,580,608 B1 * | 6/2003 | Searls | ................. | H01L 23/3675 165/185 |
| 6,665,183 B1 * | 12/2003 | Shikata | .............. | H05K 7/20918 257/721 |
| 7,265,981 B2 * | 9/2007 | Lee | .................... | H05K 7/20445 165/185 |

(Continued)

FOREIGN PATENT DOCUMENTS

| | | | |
|---|---|---|---|
| JP | H05-259673 A | 10/1993 | |
| JP | 3469475 B2 * | 11/2003 | ......... H05K 7/20918 |

*Primary Examiner* — Robert J Hoffberg
(74) *Attorney, Agent, or Firm* — Knobbe, Martens, Olson & Bear, LLP

(57) ABSTRACT

According to one embodiment, a transmitter includes a housing, an internal member, a first unit, and a second unit. The internal member is fixed to the housing. The internal member forms a first area and a second area inside the housing. The first area communicates with an outside of the housing. The second area is liquid-tightly partitioned from the first area. The first unit is in the housing. The first unit includes a first heat sink and a first circuit. The first heat sink is at least partially in the first area. The first circuit is in the second area. The second unit is in the housing. The second unit includes a second heat sink and a second circuit. The second heat sink is at least partially in the first area and facing the first heat sink. The second circuit is in the second area.

16 Claims, 9 Drawing Sheets

(56) References Cited

U.S. PATENT DOCUMENTS

| | | | | |
|---|---|---|---|---|
| 7,315,450 B2* | 1/2008 | Ishii | ............... | H01L 23/467 |
| | | | | 165/185 |
| 7,418,995 B2* | 9/2008 | Howard | ............ | H05K 7/20918 |
| | | | | 165/121 |
| 7,436,660 B2* | 10/2008 | Pedoeem | ............... | H04L 12/18 |
| | | | | 165/80.3 |
| 7,817,421 B2* | 10/2010 | Nagatomo | ......... | H05K 7/20918 |
| | | | | 165/104.33 |
| 7,898,806 B2* | 3/2011 | Isomoto | ............ | H05K 7/20918 |
| | | | | 165/121 |
| 7,957,143 B2* | 6/2011 | Isomoto | ............... | H02M 7/003 |
| | | | | 165/104.21 |
| 8,004,836 B2* | 8/2011 | Kauranen | .......... | H05K 7/20918 |
| | | | | 165/80.3 |
| 9,433,125 B2* | 8/2016 | Yan | ................... | H05K 7/20154 |
| 2008/0112135 A1* | 5/2008 | Kleinecke | ........... | H05K 7/206 |
| | | | | 361/696 |
| 2015/0062811 A1* | 3/2015 | Suzuki | ..................... | B61C 3/00 |
| | | | | 361/690 |
| 2016/0021768 A1* | 1/2016 | Webster | ................ | H05K 7/206 |
| | | | | 165/80.2 |
| 2016/0143193 A1* | 5/2016 | Ono | ........................ | H05K 7/20 |
| | | | | 361/692 |
| 2017/0188488 A1* | 6/2017 | Takezawa | .......... | H05K 7/20909 |

* cited by examiner

TRANSMITTER AND ELECTRONIC DEVICE

CROSS-REFERENCE TO RELATED APPLICATION

This application is based upon and claims the benefit of priority from Japanese Patent Application No. 2015-165168, filed Aug. 24, 2015; the entire contents of which are incorporated herein by reference.

FIELD

Embodiments described herein relate generally to a transmitter and an electronic device.

BACKGROUND

As a transmitter for satellite broadcasting, for example, a transmitter installed outdoors is known. In some cases, this type of transmitter is divided into two units including a first unit which has a power supply circuit and a second unit which has a signal circuit. The first unit and the second unit are connected to each other by waterproof cables.

However, it may be difficult to achieve miniaturization of that kind of transmitter.

DETAILED DESCRIPTION

Figure 1:
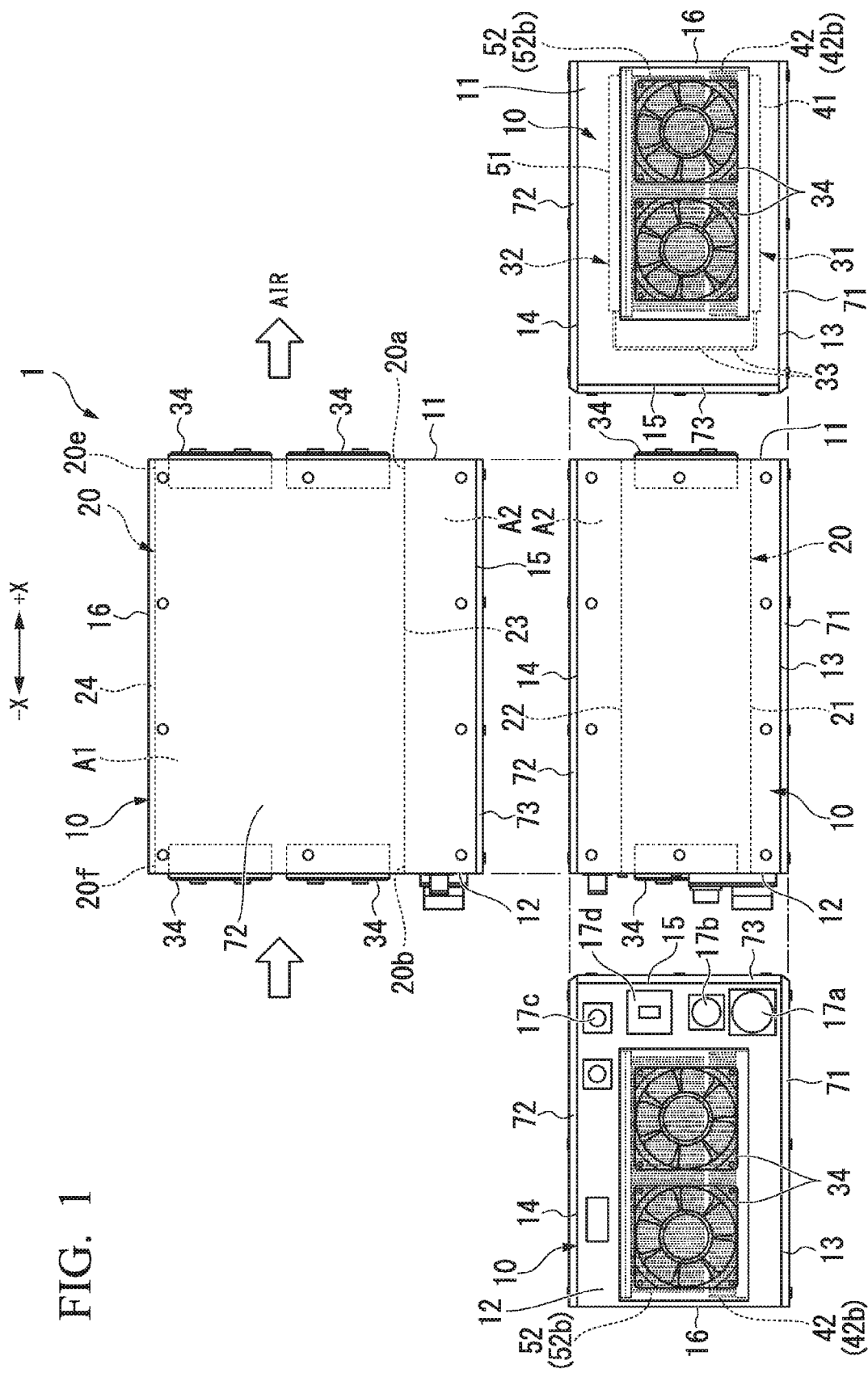
FIG. 1 is a view illustrating a transmitter of a first embodiment.

According to one embodiment, a transmitter includes a housing, an internal member, a first unit, and a second unit. The internal member is fixed to the housing. The internal member forms a first area and a second area inside the housing. The first area communicates with an outside of the housing. The second area is liquid-tightly partitioned from the first area. The first unit is in the housing. The first unit includes a first heat sink and a first circuit. The first heat sink is at least partially in the first area. The first circuit is in the second area. The second unit is in the housing. The second unit includes a second heat sink and a second circuit. The second heat sink is at least partially in the first area and facing the first heat sink. The second circuit is in the second area.

Hereinafter, a transmitter and an electronic device of embodiments will be described with reference to the drawings.

In the following description, configurations having the same or similar functions are denoted with the same reference numerals. Repeated description of the configurations may be omitted.

First Embodiment

A transmitter 1 and an electronic device of a first embodiment will be described with reference to FIGS. 1 to 8.

The transmitter 1 in the embodiment is, for example, a wireless device that constitutes a part of an outdoor unit for satellite communication. The transmitter 1 is installed outdoors and connected to a transmission antenna (not illustrated). The transmitter 1 outputs a high-frequency signal for satellite communication to the transmission antenna. A configuration in this embodiment is not limited to the transmitter and is applicable to a variety of wireless devices. Further, the transmitter 1 is an example of the "electronic device". That is, the configuration in this embodiment is not limited to the wireless device and is applicable to various electronic devices.

FIG. 1 is a view illustrating the entire configuration of the transmitter 1 in the embodiment.

As illustrated in FIG. 1, the transmitter 1 includes a housing 10, a tubular member 20, a first unit 31, a second unit 32, a plurality of cables 33, and a plurality of fans 34. Hereinafter, these configurations will be described in detail.

Figure 2:
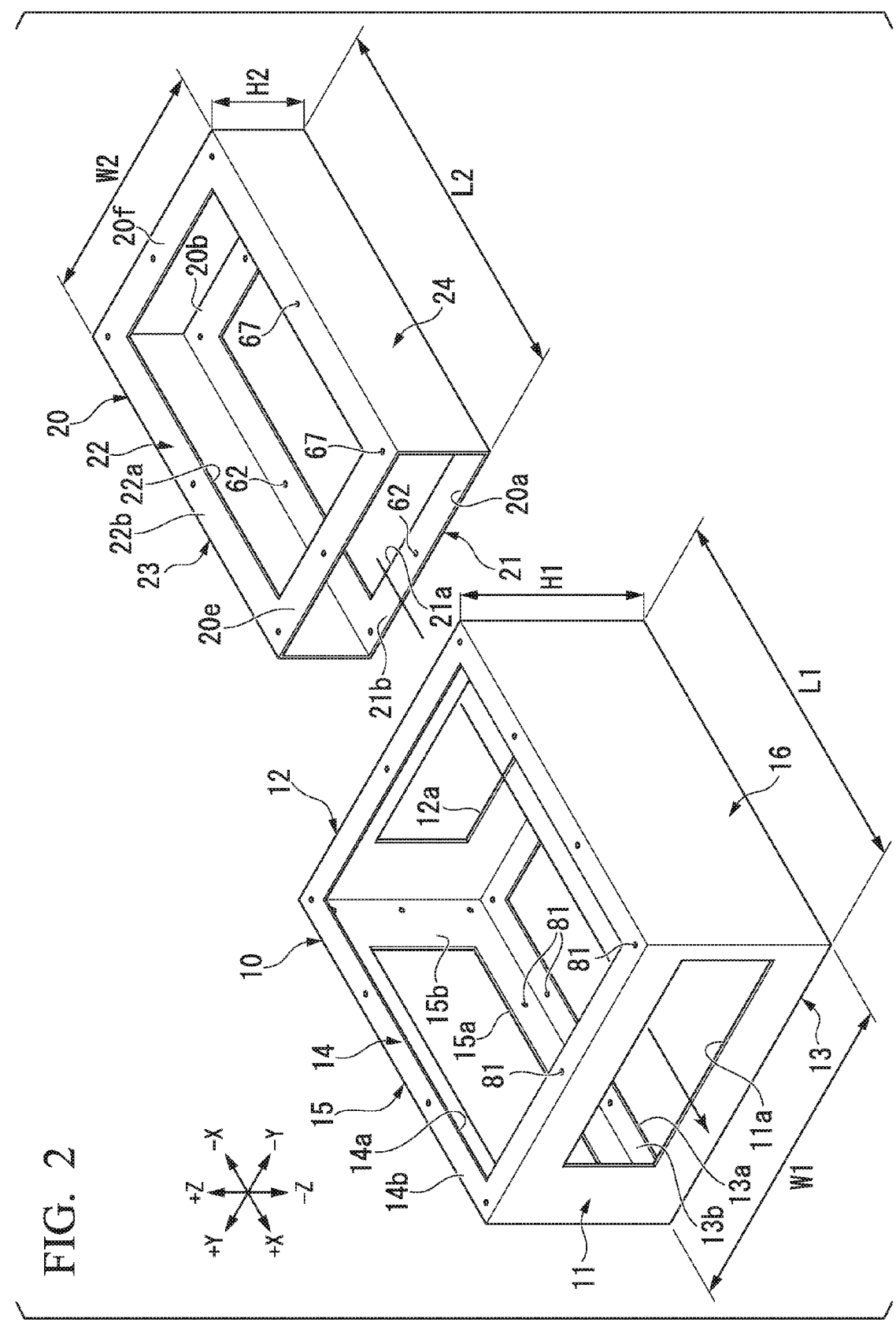
FIG. 2 is a perspective view illustrating a housing and a tubular member of the first embodiment.

FIG. 2 is a perspective view illustrating the housing 10 and the tubular member 20.

Here, a positive X direction, a negative X direction, a positive Y direction, a negative Y direction, a positive Z direction, and a negative Z direction are defined. The positive X direction is a direction in which the tubular member 20 to be described below is opened. The negative X direction is a direction opposite to the positive X direction. The positive Y direction and the negative Y direction are directions intersecting (for example, substantially perpendicular to) the positive X direction. The negative Y direction is a direction opposite to the positive Y direction. The positive Z direction and the negative Z direction are directions intersecting (for example, substantially perpendicular to) the positive X direction and the positive Y direction. The negative Z direction is a direction opposite to the positive Z direction.

As illustrated in FIG. 2, the housing 10 is a metal member and is formed in a rectangular box shape, for example. Specifically, the housing 10 includes a first wall 11, a second wall 12, a third wall 13, a fourth wall 14, a fifth wall 15, and a sixth wall 16.

The first wall 11 is a wall directed in the positive X direction. A first opening 11a opened in the positive X direction is provided in the first wall 11. The first opening 11a is formed in a shape (for example, a rectangular shape) corresponding to an outer shape of the tubular member 20 to be described below.

The second wall 12 is a wall located opposite to the first wall 11 and directed in the negative X direction. The first wall 11 and the second wall 12 are substantially parallel to each other. A second opening 12a opened in the negative X direction is provided in the second wall 12. The second opening 12a is located opposite to the first opening 11a in the housing 10. The second opening 12a is formed in a shape (for example, a rectangular shape) corresponding to the outer shape of the tubular member 20, similar to the first opening 11a.

Further, as illustrated in FIG. 1, a plurality of connectors 17a, 17b, 17c, and 17d are provided on the second wall 12. The plurality of connectors 17a, 17b, 17c, and 17d include a power input connector 17a, a control connector 17b, an RF signal input connector 17c, and an RF signal output connector 17d.

The third wall 13 is a wall directed in the negative Z direction, as illustrated in FIG. 2. A third opening 13a opened in the negative Z direction is provided in the third wall 13. The size of the third opening 13a is slightly smaller than the size of the third wall 13. Therefore, the third wall 13 includes an annular edge (a flange or a support) 13b surrounding the third opening 13a.

The fourth wall 14 is a wall located opposite to the third wall 13 and directed in the positive Z direction. The third wall 13 and the fourth wall 14 are substantially parallel to each other. The third wall 13 and the fourth wall 14 connect edges of the first wall 11 to edges of the second wall 12. A fourth opening 14a opened in the positive Z direction is provided in the fourth wall 14. The size of the fourth opening 14a is slightly smaller than the size of the fourth wall 14. Therefore, the fourth wall 14 includes an annular edge (a flange or a support) 14b surrounding the fourth opening 14a.

The fifth wall 15 is a wall directed in the positive Y direction. A fifth opening 15a opened in the positive Y direction is provided in the fifth wall 15. The size of the fifth opening 15a is smaller than the size of the fifth wall 15. Therefore, the fifth wall 15 includes an annular edge (a flange or a support) 15b surrounding the fifth opening 15a.

The sixth wall 16 is a wall directed in the negative Y direction and located opposite to the fifth wall 15. The fifth wall 15 and the sixth wall 16 are substantially parallel to each other. The fifth wall 15 and the sixth wall 16 connect edges of the first wall 11 to edges of the second wall 12 and connect edges of the third wall 13 and edges of the fourth wall 14.

Next, the tubular member 20 will be described.

The tubular member 20 is an example of each of an "internal member", a "holding member", and a "partition member". As illustrated in FIG. 2, the tubular member 20 in this embodiment is a tubular sheet metal member which is opened in the positive X direction and the negative X direction. The tubular member 20 has a cross-sectional shape taken along the positive Y direction, which is, for example, a rectangular cross-sectional shape. The tubular member 20 is accommodated in the housing 10 and fixed to the housing 10. The tubular member 20 is a holding member that holds the first unit 31 and the second unit 32 to be described below in the housing 10.

Specifically, the tubular member 20 includes a first end 20e which is an end in the positive X direction and a second end 20f which is an end in the negative X direction. Further, the length L2 in the positive X direction of the tubular member 20 is substantially the same as the length L1 in the positive X direction of the housing 10.

As illustrated in FIG. 2, the first end 20e of the tubular member 20 is inserted into the first opening 11a of the housing 10 and fixed to the edge of the first opening 11a. For example, the first end 20e of the tubular member 20 is fixed to the housing 10 by welding or the like in the entire periphery of the first opening 11a. Accordingly, the periphery of the first opening 11a is formed liquid-tightly. Further, the first end 20e of the tubular member 20 has a first ventilation port 20a opened in the positive X direction. The first ventilation port 20a is arranged on the inner peripheral side of the first opening 11a of the housing 10 and communicates with the outside of the housing 10.

Similarly, the second end 20f of the tubular member 20 is inserted into the second opening 12a of the housing 10 and fixed to the edge of the second opening 12a. For example, the second end 20f of the tubular member 20 is fixed to the housing 10 by welding or the like in the entire periphery of the second opening 12a. Accordingly, the periphery of the second opening 12a is formed liquid-tightly. Further, the second end 20f of the tubular member 20 has a second ventilation port 20b opened in the negative X direction. The second ventilation port 20b is arranged on the inner peripheral side of the second opening 12a of the housing 10 and communicates with the outside of the housing 10.

In other words, the tubular member 20 is provided between the first opening 11a and the second opening 12a of the housing 10. The tubular member 20 is formed in a tubular shape and connects the first opening 11a and the second opening 12a of the housing 10.

In this embodiment, the tubular member 20 includes a first wall 21, a second wall 22, a third wall 23, and a fourth wall 24.

The first wall 21 of the tubular member 20 is a wall directed in the negative Z direction. The first wall 21 of the tubular member 20 faces an inner surface of the third wall 13 of the housing 10. The second wall 22 of the tubular member 20 is a wall located opposite to the first wall 21 and directed in the positive Z direction. The second wall 22 of the tubular member 20 faces an inner surface of the fourth wall 14 of the housing 10.

Here, a thickness H2 in the positive Z direction of the tubular member 20 is smaller than a thickness H1 in the positive Z direction of the housing 10. Therefore, a space S1 capable of accommodating components or cables is formed between the first wall 21 of the tubular member 20 and the third wall 13 of the housing 10 (see FIG. 3). Similarly, a space S2 capable of accommodating components or cables is formed between the second wall 22 of the tubular member 20 and the fourth wall 14 of the housing 10 (see FIG. 3).

As illustrated in FIG. 2, the third wall 23 of the tubular member 20 is a wall directed in the positive Y direction. The third wall 23 faces an inner surface of the fifth wall 15 of the housing 10. The fourth wall 24 of the tubular member 20 is a wall located opposite to the third wall 23 and directed in the negative Y direction. The fourth wall 24 of the tubular member 20 faces an inner surface of the sixth wall 16 of the housing 10.

Here, the width W2 in the positive Y direction of the tubular member 20 is smaller than the width W1 in the positive Y direction of the housing 10. Therefore, a space S3 capable of accommodating components or cables is formed between the third wall 23 of the tubular member 20 and the fifth wall 15 of the housing 10 (see FIG. 3).

As illustrated in FIG. 2, the first to fourth walls 21, 22, 23 and 24 of the tubular member 20 extend over the first end 20e and the second end 20f of the tubular member 20. Therefore, when the tubular member 20 is attached to the housing 10, the first to fourth walls 21, 22, 23, and 24 of the tubular member 20 are connected to an inner surface of the first wall 11 and an inner surface of the second wall 12 of the housing 10. Accordingly, the tubular member 20 forms a first area A1 and a second area A2 liquid-tightly partitioned from each other inside the housing 10 (see FIG. 3).

Figure 3:
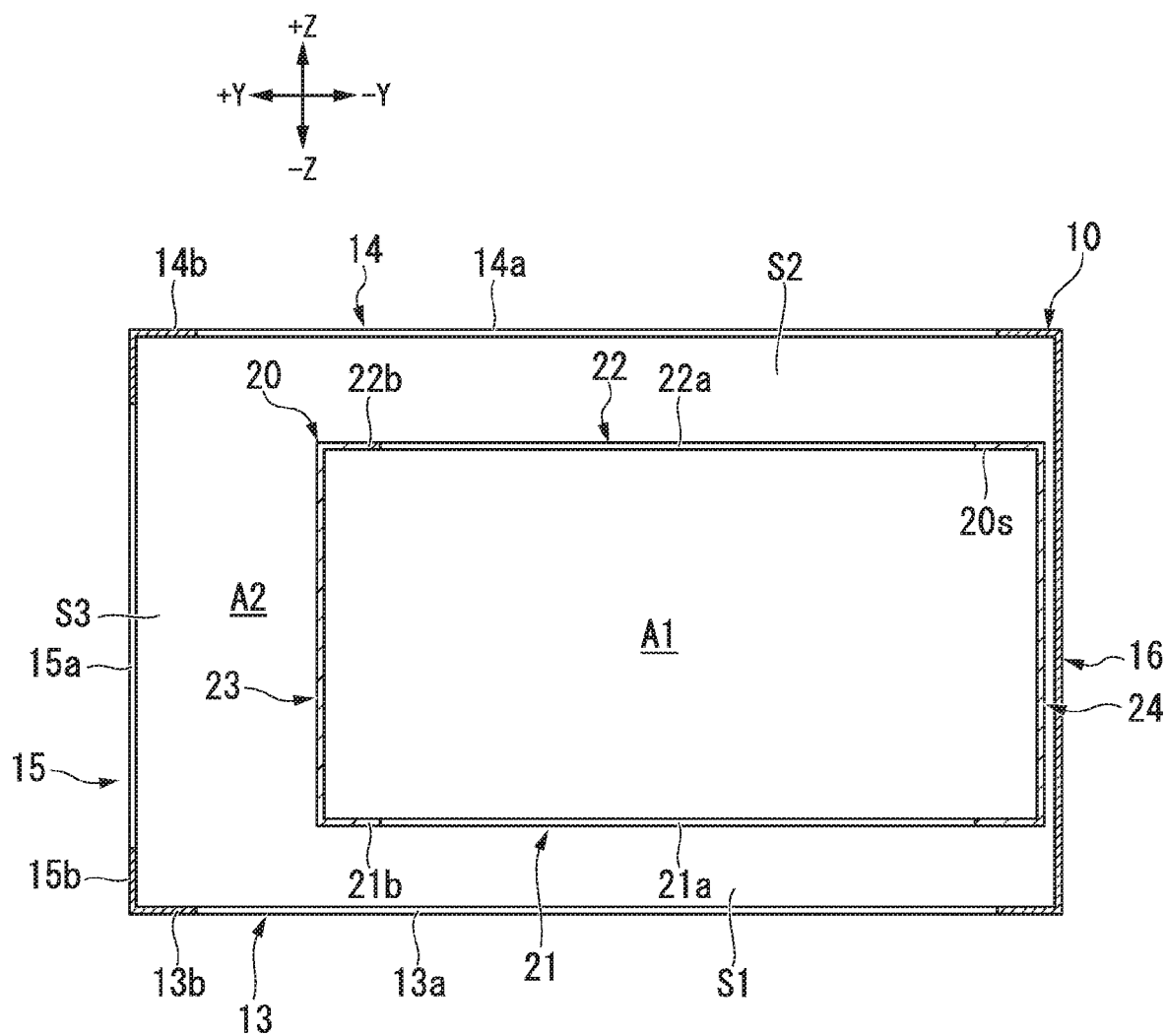
FIG. 3 is a cross-sectional view illustrating the housing and the tubular member of the first embodiment.

FIG. 3 is a cross-sectional view illustrating the housing 10 and the tubular member 20.

As illustrated in FIG. 3, the first area A1 is an area located inside the tubular member 20. That is, the first area A1 is an area surrounded by the first to fourth walls 21, 22, 23, and 24 of the tubular member 20. The first area A1 is an air passage through which air current flows due to fans 34 to be described below. The first area A1 communicates with the outside of the housing 10 through the ventilation ports 20a and 20b of the tubular member 20. The first area A1 is an area that allows inflow of wind or rain from the outside of the housing 10.

On the other hand, the second area A2 is an area located outside the tubular member 20. That is, the second area A2 is an area formed between an outer surface of the tubular member 20 and the inner surface of the housing 10.

The second area A2 is partitioned liquid-tightly from the first area A1 by the tubular member 20. The second area A2 is an area in which waterproofness can be ensured and electronic parts or the like are arranged. For example, the second area A2 includes the above-described spaces S1, S2, and S3.

Further, as illustrated in FIG. 2, the first wall 21 of the tubular member 20 has a first insertion hole 21a to which the first unit 31 to be described below is attached. The first insertion hole 21a is opened in the negative Z direction. The first insertion hole 21a is exposed to the inside of the housing 10 in a state in which the first unit 31 is removed. The size of the first insertion hole 21a is slightly smaller than the size of the first wall 21 of the tubular member 20. Therefore, the first wall 21 of the tubular member 20 has an annular edge (a flange or a support) 21b surrounding the first insertion hole 21a.

Similarly, the second wall 22 of the tubular member 20 has a second insertion hole 22a to which the second unit 32 to be described below is attached. The second insertion hole 22a is opened in the positive Z direction. The second insertion hole 22a is exposed to the inside of the housing 10 in a state in which the second unit 32 is removed. The size of the second insertion hole 22a is slightly smaller than the size of the second wall 22 of the tubular member 20. Therefore, the second wall 22 of the tubular member 20 has an annular edge (a flange or a support) 22b surrounding the second insertion hole 22a.

Next, the first unit 31 and the second unit 32 will be described.

Figure 4:
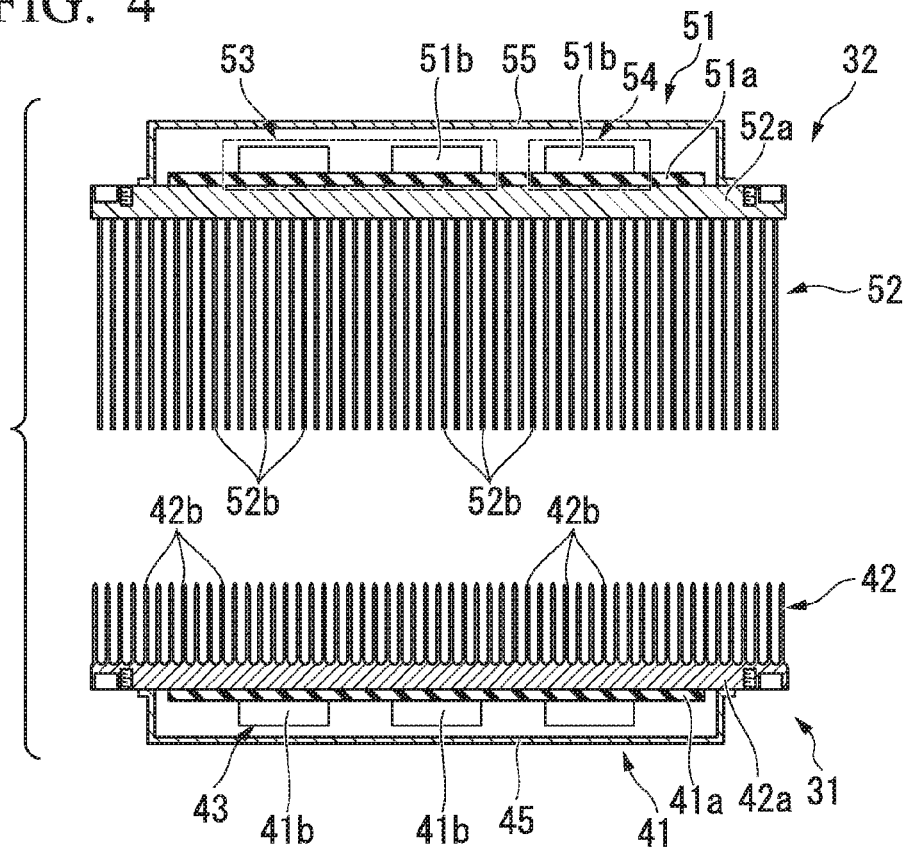
FIG. 4 is a cross-sectional view illustrating a first unit and a second unit of the first embodiment.

FIG. 4 illustrates a cross-sectional view of the first unit 31 and the second unit 32.

As illustrated in FIG. 4, the first unit 31 includes a first circuit 41, and a first heat sink 42.

The first circuit 41 includes a circuit board 41a, and a plurality of electronic components (circuit components) 41b mounted on the circuit board 41a. At least one of the electronic components 41b is a heat generation component of which the power consumption is relatively high and that generates heat during operation. The circuit board 41a and the electronic components 41b form a power supply circuit 43. An alternating current power, for example, is supplied from the outside of the transmitter 1 to the power supply circuit 43 via the power input connector 17a (see FIG. 1). The power supply circuit 43 converts the supplied alternating current power to the direct current power and produces a variety of voltages required for various electronic components 51b included in the second unit 32. The power supply circuit 43 supplies the power to the second unit 32 via the cable 33 to be described below (see FIG. 8). Further, the first circuit 41 includes a first cover member 45 attached to the first heat sink 42. The first cover member 45 covers the circuit board 41a and the electronic components 41b from the side opposite to the first heat sink 42 and functions as a shield which suppresses, for example, unnecessary radiation.

The first heat sink 42 includes a base plate 42a and a plurality of fins (heat radiator) 42b. The base plate 42a and the fins 42b are made of metal. The base plate 42a is, for example, a flat plate member. The first circuit 41 is attached to the base plate 42a and thermally connected to the base plate 42a.

The plurality of fins 42b are provided on the side opposite to the first circuit 41 with respect to the base plate 42a. The plurality of fins 42b are fixed to the base plate 42a and thermally connected to the base plate 42a. Accordingly, part of the heat generated by the first circuit 41 is moved to the plurality of fins 42b through the base plate 42a.

On the other hand, the second unit 32 includes a second circuit 51, and a second heat sink 52.

The second circuit 51 includes a circuit board 51a, and a plurality of electronic components (circuit components) 51b mounted on the circuit board 51a. At least one of the electronic components 51b is a heat generation component of which the power consumption is relatively high and that generates heat during operation. The second circuit 51 is driven by power supplied from the first circuit 41. The circuit board 51a and the electronic components 51b form, for example, a signal amplifier circuit 53 and a control circuit 54. The signal amplifier circuit 53 includes, for example, an amplifier circuit for amplifying a signal. The control circuit 54 controls, for example, the entire operation of the transmitter 1. Further, the second circuit 51 includes a second cover member 55 attached to the second heat sink 52. The second cover member 55 covers the circuit board 51a and the electronic components 51b from the side opposite to the second heat sink 52 and functions as a shield which suppresses, for example, unnecessary radiation.

The second heat sink 52 includes a base plate 52a and a plurality of fins (heat radiator) 52b. The base plate 52a and the fins 52b are made of metal. The base plate 52a is, for example, a flat plate member. The second circuit 51 is attached to the base plate 52a and thermally connected to the base plate 52a.

The plurality of fins 52b are provided on the side opposite to the second circuit 51 with respect to the base plate 52a. The plurality of fins 52b are fixed to the base plate 52a and thermally connected to the base plate 52a. Accordingly, part of the heat generated by the second circuit 51 is moved to the plurality of fins 52b through the base plate 52a.

Figure 5:
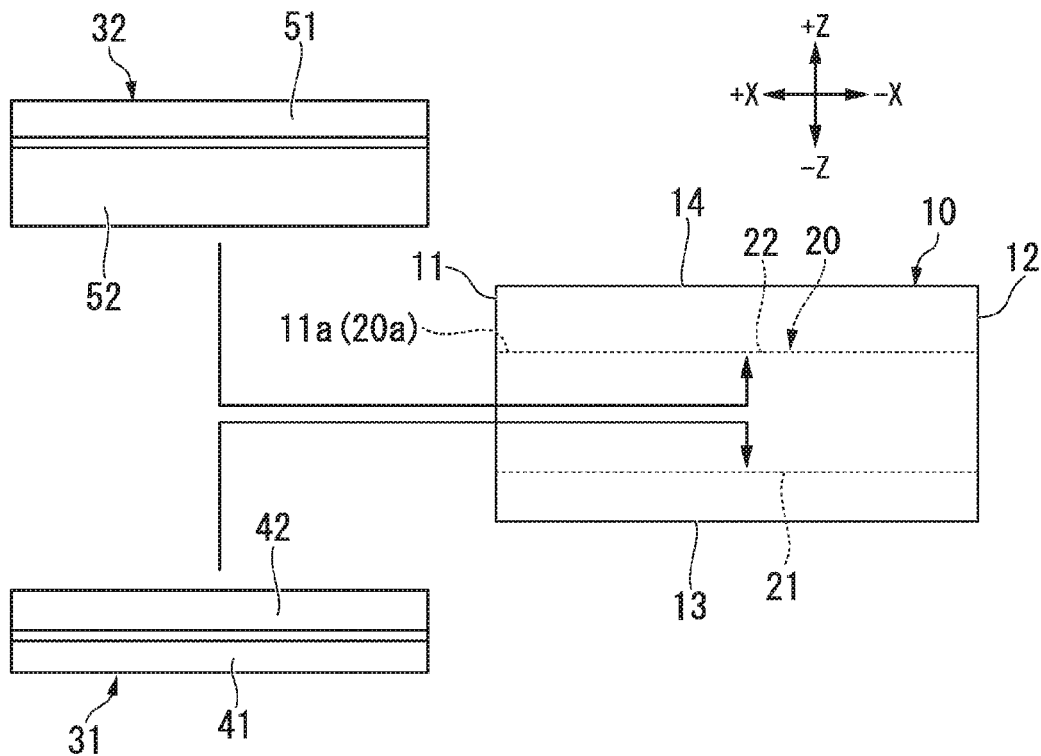
FIG. 5 is a side view illustrating an attachment structure of the first unit and the second unit of the first embodiment.

FIG. 5 illustrates an attachment structure of the first unit 31 and the second unit 32 in this embodiment.

As illustrated in FIG. 5, the first unit 31 and the second unit 32 are disposed in the housing 10. In this embodiment, the first unit 31 and the second unit 32 are inserted through the first opening 11a of the housing 10 (that is, the ventilation port 20a of the tubular member 20) into the inner side of the tubular member 20. Each of the first unit 31 and the second unit 32 is attached to an inner surface 20s (see FIG. 6) of the tubular member 20 and held in the housing 10.

Figure 6:
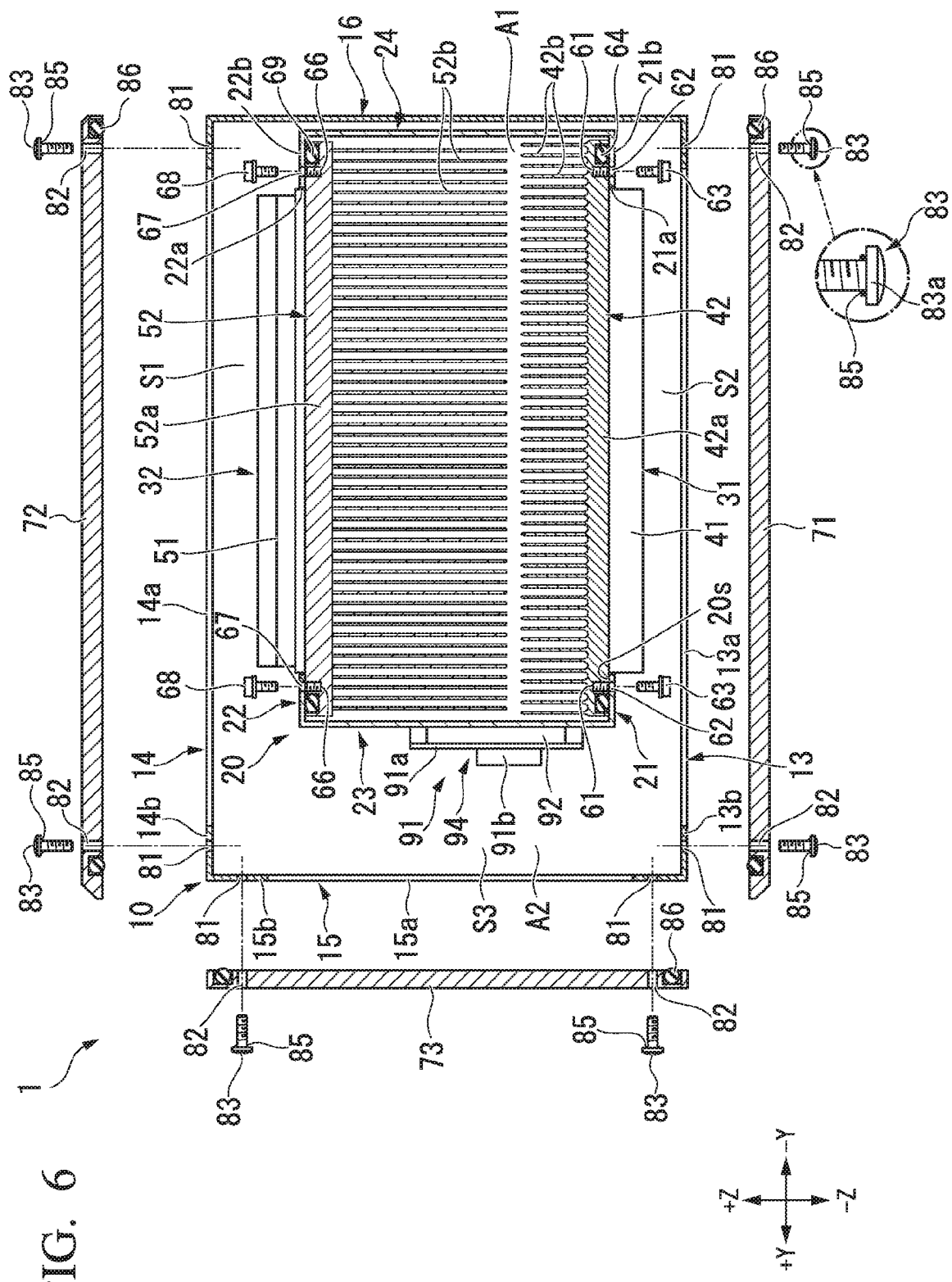
FIG. 6 is a partially exploded cross-sectional view illustrating the transmitter of the first embodiment.

FIG. 6 is a partially exploded cross-sectional view illustrating the transmitter 1.

As illustrated in FIG. 6, the first unit 31 passes through the first insertion hole 21a of the tubular member 20 and is disposed over the first area A1 and the second area A2. Specifically, at least part of the first heat sink 42 is located in the first area A1. In this embodiment, the base plate 42a and the plurality of fins 42b of the first heat sink 42 are located in the first area A1. On the other hand, the first circuit 41 passes through the first insertion hole 21a and is located in the second area A2. For example, the first circuit 41 is located in the space S1 between the first wall 21 of the tubular member 20 and the third wall 13 of the housing 10.

The second unit 32 passes through the second insertion hole 22a of the tubular member 20 and is disposed over the first area A1 and the second area A2. Specifically, at least part of the second heat sink 52 is located in the first area A1. In this embodiment, the base plate 52a and the plurality of fins 52b of the second heat sink 52 are located in the first area A1. The second heat sink 52 faces the first heat sink 42 in the first area A1. In this embodiment, the first heat sink 42 and the second heat sink 52 face each other. On the other hand, the second circuit 51 passes through the second insertion hole 22a and is located in the second area A2. For example, the second circuit 51 is located in the space S2 between the second wall 22 of the tubular member 20 and the fourth wall 14 of the housing 10.

Here, as illustrated in FIG. 1, the plurality of fans 34 are at least partially provided in the first area A1.

The plurality of fans 34 are arranged in the first area A1 at the first end 20e and the second end 20f of the tubular member 20. For example, at least part of each of the plurality of fans 34 is inserted into the inner side of the tubular member 20. Each of the plurality of fans 34 faces both of the plurality of fins 42b of the first heat sink 42 and the plurality of fins 52b of the second heat sink 52 in the positive X direction or the negative X direction.

The plurality of fans 34 generate, for example, air current in the first area A1 from the second ventilation port 20b to the first ventilation port 20a of the tubular member 20. In other words, the fan 34 is driven, and air outside the housing 10 flows from the second ventilation port 20b to the first area A1. Further, the fan 34 is driven, and the air current passing through the first area A1 is exhausted from the first ventilation port 20a to the outside of the housing 10. Accordingly, each of the plurality of fans 34 generates the air current toward both of the first heat sink 42 and the second heat sink 52. Accordingly, each of the plurality of fans 34 forcibly cools the first heat sink 42 and the second heat sink 52.

Next, a fixing structure of the first unit 31 and the second unit 32 will be described.

As illustrated in FIG. 6, the tubular member 20 includes the inner surface 20s exposed to the first area A1.

In this embodiment, the base plate 42a of the first heat sink 42 is attached to the inner surface 20s of the tubular member 20. Accordingly, the first unit 31 is fixed to the tubular member 20.

Specifically, screw holes 61 are provided in the base plate 42a of the first heat sink 42. The screw holes 61 are not through-holes, but holes with a bottom. On the other hand, the edge 21b of the first wall 21 of the tubular member 20 has through-holes 62 communicating with the screw holes 61. By engaging fastening members 63 (for example, screws) passing through the through-holes 62 with the screw holes 61, the first unit 31 is fixed to the tubular member 20. In this embodiment, the fastening members 63 are attached to the tubular member 20 from the outside of the housing 10 through the third opening 13a of the housing 10.

Here, the base plate 42a of the first heat sink 42 is larger than the first insertion hole 21a. The base plate 42a of the first heat sink 42 faces the edge 21b of the first wall 21 of the tubular member 20 over the entire periphery of the first insertion hole 21a and closes the first insertion hole 21a.

Further, a sealing member (for example, O-ring) 64 is provided between the base plate 42a of the first heat sink 42 and the inner surface of the first wall 11 of the tubular member 20. The sealing member 64 is an example of a "first sealing member". The sealing member 64 is made of, for example, rubber and has elasticity. The sealing member 64 is formed in an annular shape surrounding the entire periphery of the first insertion hole 21a. The sealing member 64 is interposed between the base plate 42a of the first heat sink 42 and the first wall 21 of the tubular member 20. The sealing member 64 is attached to the periphery of the first insertion hole 21a to seal the first insertion hole 21a liquid-tightly.

As illustrated in FIG. 6, the screw holes 61 with which the fastening members 63 are engaged are arranged on the inner side of the housing 10 (that is, near the first insertion hole 21a) relative to the sealing member 64. According to this configuration, it is possible to reduce the size of the third opening 13a of the housing 10 through which the fastening members 63 are inserted. If the size of the third opening 13a of the housing 10 can be reduced, it is possible to easily achieve the miniaturization of the transmitter 1.

Similarly, the base plate 52a of the second heat sink 52 is attached to the inner surface 20s of the tubular member 20. Accordingly, the second unit 32 is fixed to the tubular member 20.

Specifically, screw holes 66 are provided in the base plate 52a of the second heat sink 52. The screw holes 66 are not through-holes, but holes with a bottom. On the other hand, the edge 22b of the second wall 22 of the tubular member 20 has through-holes 67 communicating with the screw holes 66. By engaging fastening members 68 (for example, screws) passing through the through-holes 67 with the screw holes 66, the second unit 32 is fixed to the tubular member 20. In this embodiment, the fastening members 68 are attached to the tubular member 20 from the outside of the housing 10 through the fourth opening 14a of the housing 10.

Here, the base plate 52a of the second heat sink 52 is larger than the second insertion hole 22a. The base plate 52a of the second heat sink 52 faces the edge 22b of the second wall 22 of the tubular member 20 over the entire periphery of the second insertion hole 22a and closes the second insertion hole 22a.

Further, a sealing member (for example, O-ring) 69 is provided between the base plate 52a of the second heat sink 52 and the inner surface of the second wall 22 of the tubular member 20. The sealing member 69 is an example of a "second sealing member". The sealing member 69 is made of, for example, rubber and has elasticity. The sealing member 69 is formed in an annular shape surrounding the entire periphery of the second insertion hole 22a. The sealing member 69 is interposed between the base plate 52a of the second heat sink 52 and the second wall 22 of the tubular member 20. The sealing member 69 is attached to the periphery of the second insertion hole 22a to seal the second insertion hole 22a liquid-tightly.

As illustrated in FIG. 6, the screw holes 66 with which the fastening members 68 are engaged are arranged on the inner side of the housing 10 (that is, near the second insertion hole 22a) relative to the sealing member 69. According to this configuration, it is possible to reduce the size of the fourth opening 14a of the housing 10 through which the fastening members 68 are inserted. If the size of the fourth opening 14a of the housing 10 can be reduced, it is possible to easily achieve the miniaturization of the transmitter 1.

Next, first, second, and third lids 71, 72, and 73 attached to the housing 10 will be described. As illustrated in FIG. 6, the first lid (bottom plate) 71 is attached to the third wall 13 of the housing 10. Specifically, screw holes 81 are provided in the edge 13b of the third wall 13 of the housing 10.

On the other hand, the first lid 71 has through-holes 82 communicating with the screw holes 81. By engaging fastening members 83 (for example, screws) passing through the through-holes 82 with the screw holes 81, the first lid 71 is fixed to the housing 10. Further, as illustrated in FIG. 6, a sealing member 85 (for example, O-ring) is provided between each of head portions 83a of the fastening members 83 and the first lid 71. The sealing member 85 is made of, for example, rubber and has elasticity. The sealing member 85 is formed in an annular shape surrounding the entire periphery of the through-hole 82. The sealing member 85 is interposed between the head portions 83a of the fastening members 83 and the first lid 71. The sealing member 85 is attached to the periphery of the through-hole 82 to seal the through-hole 82 liquid-tightly.

The size of the first lid 71 is greater than the size of the third opening 13a. The first lid 71 faces the edge 13b of the third wall 13 of the housing 10 in the entire periphery of the third opening 13a and closes the third opening 13a.

Further, a sealing member (for example, O-ring) 86 is provided between the first lid 71 and the third wall 13 of the housing 10. The sealing member 86 is made of, for example, rubber and has elasticity. The sealing member 86 is formed in an annular shape surrounding the entire periphery of the third opening 13a. The sealing member 86 is interposed between the first lid 71 and the third wall 13 of the housing 10. The sealing member 86 is attached to the periphery of the third opening 13a to seal the third opening 13a liquid-tightly.

An attachment structure and a seal structure of the second lid (top plate) 72 and the third lid (side plate) 73 for the housing 10 are substantially the same as the attachment structure and the seal structure of the first lid 71 for the housing 10. For the attachment structure and the seal structure of the second lid 72 and the third lid 73 for the housing 10, "first lid 71" may be rearranged with "second lid 72" or "third lid 73", "third wall 13" may be rearranged with "fourth wall 14" or "fifth wall 15", "third opening 13a" may be rearranged with "fourth opening 14a" or "fifth opening 15a", "edge 13b" may be rearranged with "edge 14b" or "edge 15b" in the above description of the attachment structure and the seal structure of the first lid 71 for the housing 10.

Figure 7:
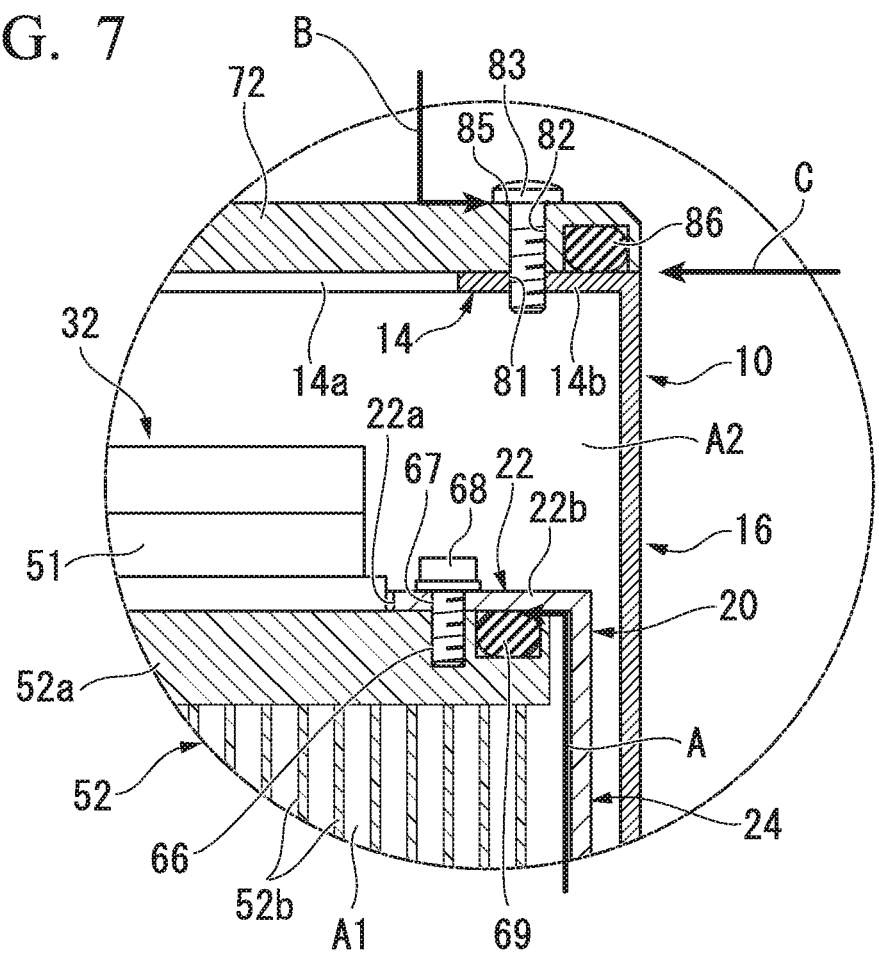
FIG. 7 is a partially enlarged cross-sectional view illustrating the transmitter of the first embodiment.

FIG. 7 is a cross-sectional view illustrating an enlarged part of the transmitter 1.

By having the above-described configuration, intrusion of liquid from the outside and the first area A1 of the housing 10 to the second area A2 of the housing 10 is suppressed, as illustrated in FIG. 7. For example, a flow of liquid directed from the first area A1 to the second insertion hole 22a of the tubular member 20 (see arrow A) is dammed by a sealing member 69. Similarly, a flow of liquid directed from the first area A1 to the first insertion hole 21a is dammed by the sealing member 64. Therefore, intrusion of the liquid from the first area A1 to the second area A2 is suppressed.

Further, flows of the liquid directed from the outside of the housing 10 to the fourth opening 14a of the housing 10 (see arrows B and C) are dammed by the sealing members 85 and 86. The same applies to the third opening 13a and the fifth opening 15a of the housing 10. Therefore, intrusion of the liquid from the outside of the housing 10 to the second area A2 is suppressed.

Therefore, the second area A2 is liquid-tightly isolated from the outside and the first area A1 of the housing 10, and waterproofness is ensured.

Figure 8:
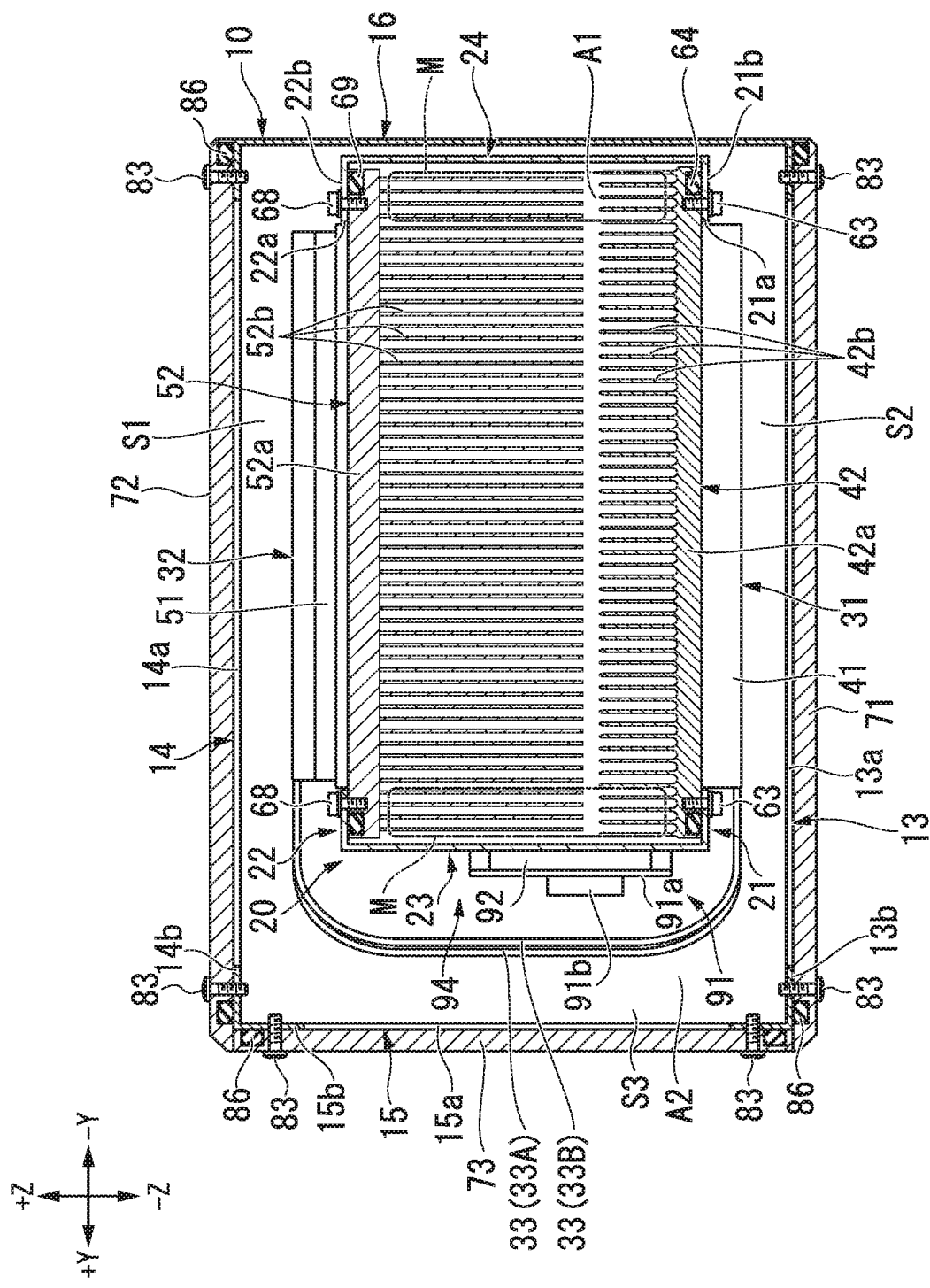
FIG. 8 is a cross-sectional view illustrating the transmitter of the first embodiment.

FIG. 8 is a cross-sectional view of the transmitter 1 in the embodiment.

As illustrated in FIG. 8, in this embodiment, a plurality of cables 33 are provided in the second area A2 in which waterproofness is secured. The cables 33 extend within the second area A2, and are connected to the first unit 31 and the second unit 32. Specifically, the cables 33 pass through the spaces S1, S2, and S3 and extend between the first unit 31 and the second unit 32. The cables 33 electrically connect the first circuit 41 of the first unit 31 and the second circuit 51 of the second unit 32. The plurality of cables 33 include a power supply line 33A and a signal line 33B. The first circuit 41 supplies power to the second circuit 51 via the power supply line 33A. Further, the first circuit 41 and the second circuit 51 transmit and receive various signals to and from each other via the signal line 33B.

Here, as illustrated in FIG. 8, the fifth opening 15a of the housing 10 faces the cables 33.

Work of connecting the cable 33 to the first unit 31 and the second unit 32 or work of attaching the cable 33 in the housing 10 is at least partially performed, for example, through the fifth opening 15a. If the fifth opening 15a is provided, workability of the connection work and the attachment work regarding the cables 33 is improved.

Further, as illustrated in FIG. 8, a third circuit 91 is accommodated in the second area A2. The third circuit 91 includes a circuit board 91a, and electronic part components (circuit components) 91b mounted on the circuit board 91a. At least one of electronic components 91b is a heat generation component in which the power consumption is relatively high and that generates heat during operation. The third circuit 91 forms, for example, a control circuit 94 which controls part of the operation of the transmitter 1.

The third circuit 91 is attached to the third wall 23 of the tubular member 20. Here, the third circuit 91 faces the fifth opening 15a of the housing 10. The third circuit 91, for example, is attached to the third wall 23 of the tubular member 20 through the fifth opening 15a of the housing 10. A thermally conductive sheet 92 having good thermal conductivity is interposed between the third circuit 91 and the third wall 23 of the tubular member 20. The third circuit 91 is thermally connected to the third wall 23 of the tubular member 20 via the thermally conductive sheet 92. Therefore, part of heat generated by the third circuit 91 is transferred to the third wall 23 of the tubular member 20. The heat transferred to the third wall 23 of the tubular member 20 is radiated by the air current flowing into the inside (first area A1) of the tubular member 20.

According to this configuration, it is possible to miniaturize the transmitter 1.

Here, as a comparative example 1, a transmitter divided into a first unit including a power supply circuit and a first heat sink, and a second unit including a signal circuit and a second heat sink is considered. In such a transmitter, the first unit and the second unit are connected to each other by a cable which is in consideration of waterproofness. In such a transmitter, since the unit is divided in two, a double installation area is necessary. If the two units overlap vertically, an installation area including the cable is relatively large. This is because miniaturization of the cable which has the waterproofness is difficult.

Further, as a comparative example 2, a transmitter in which a first heat sink connected to a power supply circuit and a second heat sink connected to a signal circuit are arranged to be directed in opposite directions, and the power supply circuit and the signal circuit to be accommodated in one housing is considered. In such a transmitter, waterproofness is not necessary for a cable connecting the units. However, since the first heat sink and the second heat sink are arranged to be separated, it is necessary to provide a fan for each heat sink. Therefore, the number of fans increases. Further, an outer shape of the fan becomes larger than a height of fins of the heat sink, and cooling efficiency of the fan may not be sufficiently exhibited.

On the other hand, in this embodiment, the transmitter 1 includes the housing 10, the tubular member 20, the first unit 31, and the second unit 32. The tubular member 20 is fixed to the housing 10, and the first area A1 communicating with the outside of the housing 10, and the second area A2 partitioned liquid-tightly from the first area A1 are formed in the inside of the housing 10. The first unit 31 and the second unit 32 are disposed in the housing 10. The first unit 31 includes the first heat sink 42 at least partially located in the first area A1, and the first circuit 41 located in the second area A2. The second unit 32 includes the second heat sink 52 at least partially located in the first area A1 and facing the first heat sink 42, and the second circuit 51 located in the second area A2.

According to this configuration, it is possible to arrange necessary parts (for example, the first circuit 41 and the second circuit 51) using the second area A2 in which waterproofness is ensured, and arrange a plurality of heat sinks 42 and 52 together using the first area A1. Therefore, it is possible to arrange the plurality of heat sinks 42 and 52 to be close to each other and make a small heat dissipation structure. Accordingly, it is possible to achieve miniaturization of the transmitter 1.

In this embodiment, the first unit 31 and the second unit 32 are attached to the tubular member 20. The tubular member 20 holds the first unit 31 and the second unit 32 in the housing 10. According to this configuration, the first unit 31 and the second unit 32 can be held in the housing 10 using the tubular member 20 that is provided for partition into the first area A1 and the second area A2. In other words, a dedicated member that holds the first unit 31 and the second unit 32 is not necessary. Therefore, it is possible to further achieve the miniaturization of the transmitter 1.

In this embodiment, the transmitter 1 includes the fans 34. The fans 34 are at least partially provided in the first area A1 and generate air current toward the first heat sink 42 and the second heat sink 52. According to this configuration, since the first heat sink 42 and the second heat sink 52 are arranged together in the first area A1, it is possible to reduce the number of fans 34 required to generate air current toward the first heat sink 42 and the second heat sink 52. Further, if the first heat sink 42 and the second heat sink 52 are arranged together in the first area A1, the outer shape of the fan 34 is not likely to be much large as compared to the heights of the fins 42*b* and 52*b* of the heat sinks 42 and 52. Accordingly, it is possible for the cooling efficiency of the fans 34 to be sufficiently exhibited.

In this embodiment, the transmitter 1 includes the cables 33. The cables 33 extend in the second area A2, and electrically connect the first circuit 41 and the second circuit 51. According to this configuration, since the cables 33 are provided in the second area A2 partitioned liquid-tightly from the first area A1, it is possible to employ a cable 33 of which the waterproofness is not considered. The cable 33 of which the waterproofness is not considered is smaller than a cable of which the waterproofness is considered and can be easily led and, for example, can be bent with a small radius. Therefore, it is possible to reduce the installation area of the transmitter 1 including the cables 33.

In this embodiment, the housing 10 includes the first opening 11*a*, and the second opening 12*a* located opposite to the first opening 11*a*. The tubular member 20 is formed in a tubular shape and connects the first opening 11*a* to the second opening 12*a*. According to this configuration, it is possible to form the first area A1 and the second area A2 partitioned liquid-tightly from each other inside the housing 10 using a relatively simple structure. Accordingly, it is possible to further achieve the miniaturization of the transmitter 1.

In this embodiment, the tubular member 20 has the first insertion hole 21*a* and the second insertion hole 22*a* which can be exposed to the inside of the housing 10. The first unit 31 passes through the first insertion hole 21*a*. The first unit 31 is disposed over the first area A1 and the second area A2. The second unit 32 passes through the second insertion hole 22*a*. The second unit 32 is arranged over the first area A1 and the second area A2. The sealing member 64 is provided between the tubular member 20 and the first unit 31. The sealing member 64 is attached to the periphery of the first insertion hole 21*a* to seal the first insertion hole 21*a* liquid-tightly. The sealing member 69 is provided between the tubular member 20 and the second unit 32. The sealing member 69 is attached to the periphery of the second insertion hole 22*a* to seal the second insertion hole 22*a* liquid-tightly.

According to this configuration, the first unit 31 and the second unit 32 can be arranged over the first area A1 and the second area A2, and liquid tightness between the first area A1 and the second area A2 can be relatively easily ensured.

In this embodiment, the first opening 11*a* is sized such that the first unit 31 can be inserted into the tubular member 20 through the first opening 11*a* from the outside of the housing 10. Further, the first opening 11*a* is sized such that the second unit 32 can be inserted into the tubular member 20 through the first opening 11*a* from the outside of the housing 10. According to this configuration, it is possible to relatively easily adopt a structure for attaching the first unit 31 and the second unit 32 to the inner surface 20*s* of the tubular member 20.

In this embodiment, the tubular member 20 includes the inner surface 20*s* which is exposed to the first area A1. The first unit 31 is attached to the inner surface 20*s* of the tubular member 20. The first circuit 41 passes through the first insertion hole 21*a* of the tubular member 20. According to this configuration, the fins 42*b* of the first heat sink 42 can also be arranged in an outer peripheral area (area indicated by an alternate long and short dash line M in FIG. 8) which is located outward than the first insertion hole 21*a*. In other words, the fins 42*b* can also be arranged in an area (area aligned with the edge 21*b* in the positive Z direction) corresponding to the back side of the edge 21*b* of the first wall 21 of the tubular member 20. Therefore, according to the above configuration, it is possible to arrange more fins 42*b* than those in a second embodiment described below. In other words, according to the above configuration, it is possible to arrange a large heat sink 42. Accordingly, it is possible to improve heat dissipation properties of the transmitter 1. This also applies to a case in which the second unit 32 is attached to the inner surface 20*s* of the tubular member 20. The second circuit 51 passes through the second insertion hole 22*a* of the tubular member 20.

Second Embodiment

Next, a transmitter 1 and an electronic device of a second embodiment will be described with reference to FIGS. 9 and 10. This embodiment is different from the first embodiment in an attachment structure of the first unit 31 and the second unit 32. Other configurations of this embodiment are the same as those of the first embodiment.

Figure 9:
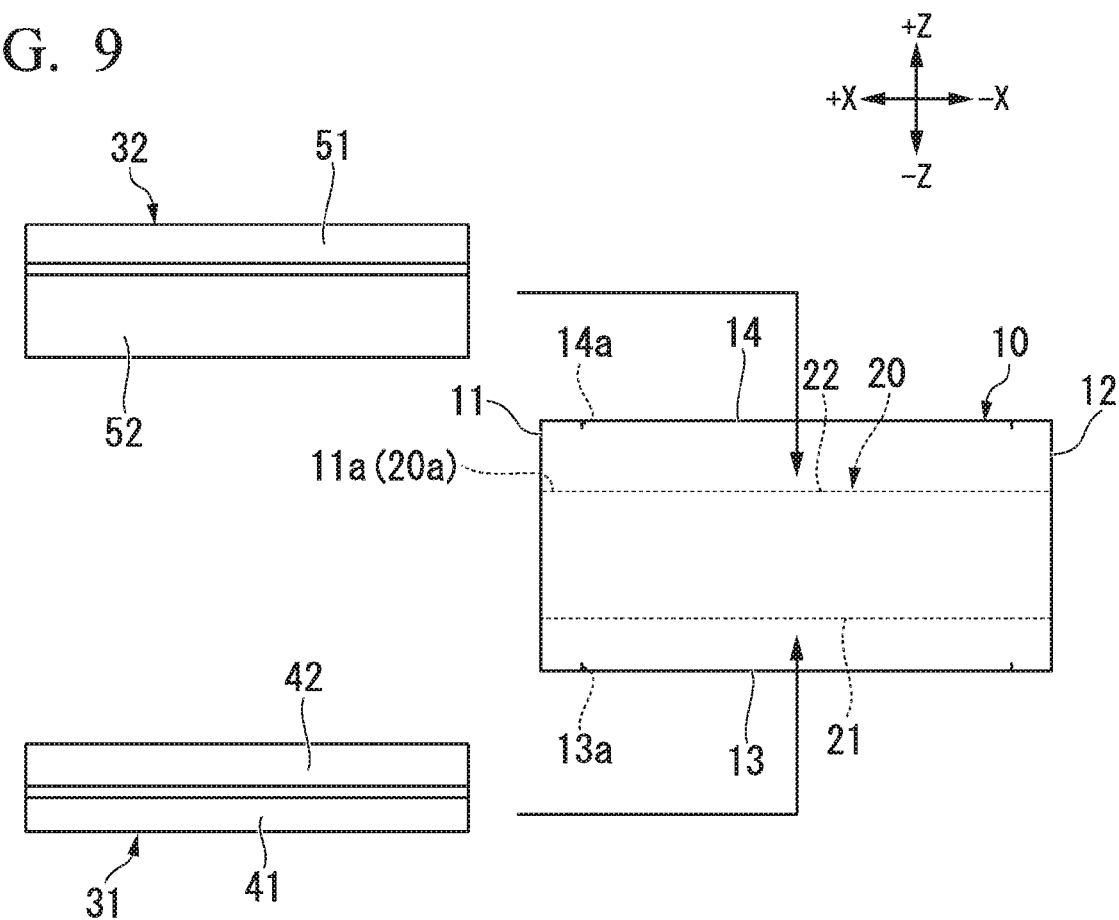
FIG. 9 is a side view illustrating an attachment structure of a first unit and a second unit of a second embodiment.

FIG. 9 illustrates an attachment structure of the first unit 31 and the second unit 32.

As illustrated in FIG. 9, in this embodiment, the first unit 31 is inserted into the housing 10 from the third opening 13a of the housing 10 and attached to the tubular member 20. Further, the second unit 32 is inserted into the housing 10 from the fourth opening 14a of the housing 10 and attached to the tubular member 20.

Figure 10:
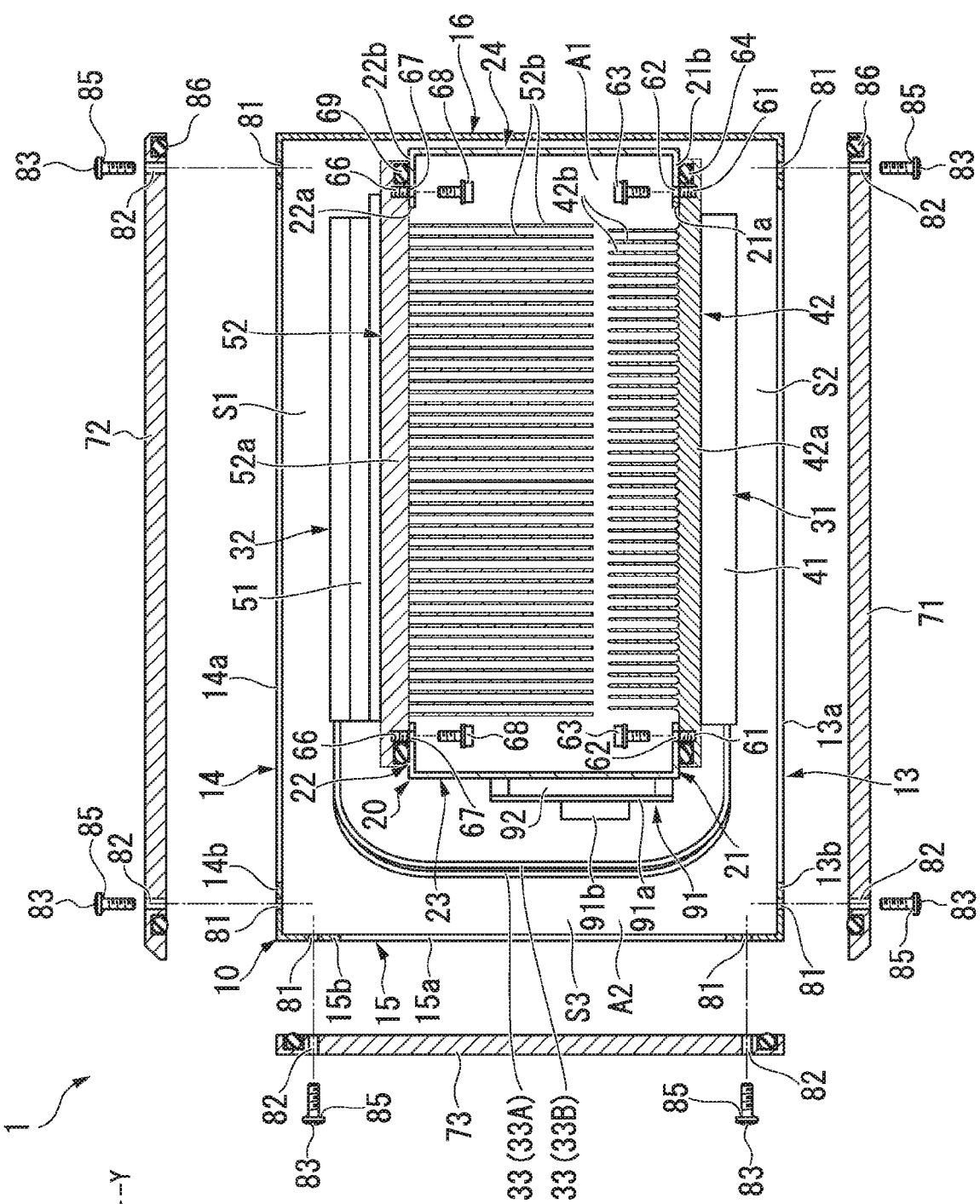
FIG. 10 is a partially exploded cross-sectional view illustrating a transmitter of the second embodiment.

FIG. 10 is a cross-sectional view illustrating the transmitter 1 in this embodiment.

As illustrated in FIG. 10, the first unit 31 is attached to an outer surface of the first wall 21 of the tubular member 20. Specifically, in this embodiment, the base plate 42a of the first heat sink 42 is located in the second area A2. The base plate 42a of the first heat sink 42 is attached to the outer surface of the edge 21b of the first wall 21 of the tubular member 20. The plurality of fins 42b of the first heat sink 42 pass through the first insertion hole 21a from the outer side to the inner side of the tubular member 20 and are located in the first area A1.

Similarly, the second unit 32 is attached to an outer surface of the second wall 22 of the tubular member 20. Specifically, in this embodiment, the base plate 52a of the second heat sink 52 is located in the second area A2. The base plate 52a of the second heat sink 52 is attached to the outer surface of the edge 22b of the second wall 22 of the tubular member 20. The plurality of fins 52b of the second heat sink 52 pass through the second insertion hole 22a from the outer side to the inner side of the tubular member 20 and are located in the first area A1.

According to such a configuration, it is possible to achieve the miniaturization of the transmitter 1, as in the first embodiment.

Several embodiments have been described, but are not limited to the above examples.

For example, it is not necessary for the fans 34 to be provided in both of the first end 20e and the second end 20f of the tubular member 20, and the fan 34 may be provided in any one of the ends.

Further, an internal member which forms the first area A1 and the second area A2 in the housing 10 is not limited to the tubular member.

According to at least one embodiment described above, an internal member of a transmitter forms a first area communicating with the outside of the housing and a second area liquid-tightly partitioned from the first area inside the housing. A first unit is disposed in the housing and includes a first heat sink at least partially located in the first area, and a first circuit located in the second area. A second unit is disposed in the housing, and includes a second heat sink at least partially located in the first area and facing the first heat sink, and a second circuit located in the second area. According to this configuration, it is possible to achieve the miniaturization of the transmitter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transmitter comprising:
a housing;
an internal member fixed to the housing, the internal member dividing the housing into a first area and a second area, the first area communicating with an outside of the housing, the second area being liquid-tightly partitioned from the first area, the internal member having a first insertion hole and a second insertion hole, the second insertion hole opposing the first insertion hole, the first insertion hole and the second insertion hole being capable of being exposed to an inside of the housing;
a first unit disposed in the housing, the first unit being configured to pass through the first insertion hole to be disposed in the first area and the second area, the first unit comprising a first heat sink and a first circuit, the first heat sink being at least partially in the first area and the first circuit being in the second area; and
a second unit disposed in the housing, the second unit being configured to pass through the second insertion hole to be disposed in the first area and the second area, the second unit comprising a second heat sink and a second circuit, the second heat sink being at least partially in the first area and facing the first heat sink and the second circuit being in the second area.

2. The transmitter according to claim 1, wherein
the first unit and the second unit are attached to the internal member, and
the internal member holds the first unit and the second unit in the housing.

3. The transmitter according to claim 1, further comprising:
a fan at least partially provided in the first area, the fan being configured to generate air current toward the first heat sink and the second heat sink.

4. The transmitter according to claim 1, further comprising:
a cable extending in the second area, the cable electrically connecting the first circuit and the second circuit.

5. The transmitter according to claim 1, wherein
the housing has a first opening and a second opening located opposite to the first opening, and
the internal member is formed in a tubular shape and connects the first opening to the second opening.

6. The transmitter according to claim 5, further comprising:
a first sealing member between the internal member and the first unit; and
a second sealing member between the internal member and the second unit, wherein
the first sealing member is attached to a periphery of the first insertion hole to seal the first insertion hole liquid-tightly, and the second sealing member is attached to a periphery of the second insertion hole to seal the second insertion hole liquid-tightly.

7. The transmitter according to claim 6, wherein
the first opening is sized such that the first unit is capable of being inserted into the internal member through the first opening from the outside of the housing.

8. The transmitter according to claim 7, wherein
the internal member has an inner surface exposed to the first area, and
the first unit is attached to the inner surface of the internal member and the first circuit passes through the first insertion hole.

9. An electronic device comprising:
a housing;
an internal member fixed to the housing, the internal member dividing the housing into a first area and a second area, the first area communicating with an outside of the housing, the second area being liquid-tightly partitioned from the first area, the internal member having a first insertion hole and a second insertion hole, the second insertion hole opposing the first insertion hole, the first insertion hole and the second insertion hole being capable of being exposed to an inside of the housing;
a first unit disposed in the housing, the first unit being configured to pass through the first insertion hole to be disposed in the first area and the second area, the first unit comprising a first heat sink and a first circuit, the first heat sink being at least partially in the first area and the first circuit being in the second area; and
a second unit disposed in the housing, the second unit being configured to pass through the second insertion hole to be disposed in the first area and the second area, the second unit comprising a second heat sink and a second circuit, the second heat sink being at least partially in the first area and facing the first heat sink and the second circuit being in the second area.

10. The electronic device according to claim 9, wherein
the first unit and the second unit are attached to the internal member, and
the internal member holds the first unit and the second unit in the housing.

11. The electronic device according to claim 9, further comprising:
a fan at least partially provided in the first area, the fan being configured to generate air current toward the first heat sink and the second heat sink.

12. The electronic device according to claim 9, further comprising:
a cable extending in the second area, the cable electrically connecting the first circuit and the second circuit.

13. The electronic device according to claim 9, wherein
the housing has a first opening and a second opening located opposite to the first opening, and
the internal member is formed in a tubular shape and connects the first opening to the second opening.

14. The electronic device according to claim 13, further comprising:
a first sealing member between the internal member and the first unit; and
a second sealing member between the internal member and the second unit, wherein
the first sealing member is attached to a periphery of the first insertion hole to seal the first insertion hole liquid-tightly, and the second sealing member is attached to a periphery of the second insertion hole to seal the second insertion hole liquid-tightly.

15. The electronic device according to claim 14, wherein
the first opening is sized such that the first unit is capable of being inserted into the internal member through the first opening from the outside of the housing.

16. The electronic device according to claim 15, wherein
the internal member has an inner surface exposed to the first area, and
the first unit is attached to the inner surface of the internal member and the first circuit passes through the first insertion hole.

* * * * *